United States Patent
Zhao et al.

(10) Patent No.: US 8,692,949 B2
(45) Date of Patent: Apr. 8, 2014

(54) TFT-LCD ARRAY SUBSTRATE WHEREIN DATA LINE SEGMENTS IN ADJACENT PIXEL REGIONS WITHIN A SAME COLUMN ARE CONNECTED BY A FIRST CONNECTION BAR

(75) Inventors: Xin Zhao, Beijing (CN); Xing Ming, Beijing (CN); Weifeng Zhou, Beijing (CN); Wenyu Zhang, Beijing (CN); Jian Guo, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 769 days.

(21) Appl. No.: 12/749,679

(22) Filed: Mar. 30, 2010

(65) Prior Publication Data
US 2010/0245700 A1 Sep. 30, 2010

(30) Foreign Application Priority Data
Mar. 30, 2009 (CN) .......................... 2009 1 0081210

(51) Int. Cl.
*G02F 1/136* (2006.01)
*G02F 1/1343* (2006.01)
(52) U.S. Cl.
USPC ............................................ 349/48; 349/139
(58) Field of Classification Search
USPC ............................... 349/42, 48, 139, 141–143
See application file for complete search history.

(56) References Cited

U.S. PATENT DOCUMENTS

| | | | |
|---|---|---|---|
| 6,075,505 A * | 6/2000 | Shiba et al. | 345/87 |
| 2006/0290863 A1 | 12/2006 | HoeSup | |
| 2008/0001902 A1 | 1/2008 | Kim | |
| 2008/0129669 A1* | 6/2008 | Kim | 345/88 |
| 2009/0073365 A1 | 3/2009 | Jeon | |
| 2010/0103085 A1 | 4/2010 | Lee et al. | |

FOREIGN PATENT DOCUMENTS

| | | |
|---|---|---|
| CN | 1885140 A | 12/2006 |
| CN | 101634786 A | 1/2010 |
| CN | 101726893 A | 6/2010 |

* cited by examiner

*Primary Examiner* — Paul Lee
(74) *Attorney, Agent, or Firm* — Ladas & Parry LLP

(57) ABSTRACT

A TFT-LCD array substrate, a manufacturing method thereof and a liquid crystal display panel are provided in the invention. The TFT-LCD array substrate comprises a plurality of first gate lines and a plurality of first data lines, and a plurality of pixel regions are defined by intersecting the first gate lines and the first data lines with each other. A first pixel electrode and a first TFT are formed in each of the pixel regions, and a second TFT and a second pixel electrode are further comprised in each of the pixel regions. The second TFT is connected with the second pixel electrode, the first pixel electrode and the second pixel electrode form the voltage difference to drive the reversion of the liquid crystal molecules, and the first TFT and the second TFT are turned on or off simultaneously.

5 Claims, 16 Drawing Sheets

A2 - A2

B2 - B2

TFT-LCD ARRAY SUBSTRATE WHEREIN DATA LINE SEGMENTS IN ADJACENT PIXEL REGIONS WITHIN A SAME COLUMN ARE CONNECTED BY A FIRST CONNECTION BAR

BACKGROUND

Embodiments of the present invention relate to a thin film transistor liquid crystal display (TFT-LCD) array substrate, a manufacturing method thereof and a liquid crystal display panel.

In forming an array substrate of a horizontal electric field type TFT-LCD, a transparent conductive film is first deposited on a transparent substrate to form a common electrode, and then a pixel electrode is formed on the substrate. The electric field parallel to the transparent substrate is generated between the pixel electrode and the common electrode, and the liquid crystal molecules rotate in the plane parallel to the transparent substrate under the above electric field. The non-overlapping portion, between the pixel electrode and the common electrode forms liquid crystal capacitance, and the overlapping portion between the pixel electrode and the common electrode forms storage capacitance to maintain the voltage on the pixel electrode.

Feed through may be generated during the process of applying a voltage to the pixel electrode. The voltage of the feed through is expressed as follows: $\Delta v = (\Delta \text{gate} \cdot C_{gd})/(C_{gd} + C_{st} + C_{lc})$, where $\Delta v$ is the feed through voltage, $\Delta$Gate is the gate voltage of the TFT as a switching element, $C_{gd}$ is the capacitance generated by the overlapping portion between the gate electrode and the drain electrode of the TFT; $C_{st}$ is the storage capacitance between the pixel electrode and the common electrode, and $C_{lc}$ is the liquid crystal capacitance between the pixel electrode and the common electrode. The voltage applied on the pixel electrode is reduced due to the feed through voltage.

The reversion of the liquid crystal molecules is accomplished by the voltage difference between the pixel electrode and the common electrode. In order to retard the aging of the liquid crystal molecules, the voltage difference on both sides of the liquid crystal molecules between adjacent frames is reversed. During the display of the image, the discontinuity of the image brightness is generated between adjacent frames due to the drop of the pixel electrode voltage. FIG. 13 is a diagram showing the occurrence of the feed through voltage on the pixel electrode of a conventional TFT-LCD array substrate.

During the period of the n-th frame, the signal 11 input to the gate electrode at the initial stage is at a high level, the TFT in the pixel region is turned on, and the signal 12 input to the data line is conducted to the pixel electrode through the TFT. At the same time, the voltage of the signal 13 input to the pixel electrode is larger than that of the signal 14 input to the common electrode. Compared with the signal 12 input to the data line, the signal 13 input to the pixel electrode is decreased due to the existence of feed through. Thus, the voltage difference between the signal 13 input to the pixel electrode and the signal 14 input to the common electrode is smaller than the desired voltage difference, that is, the voltage difference applied on both sides of the liquid crystal molecules is smaller than the desired voltage difference.

During the period of the (n+1)-th frame display, the signal 11 input to the gate electrode at the initial stage is at a high level, the TFT in the pixel region is turned on, and the signal 12 input to the data line is conducted to the pixel electrode through the TFT. At the same time, the voltage of the signal 13 input to the pixel electrode is smaller than that of the signal 14 input to the common electrode. Compared with the signal 12 input to the data line, the signal 13 input to the pixel electrode is decreased due to the feed through. Thus, the voltage difference between the signal 13 input to the pixel electrode and the signal 14 input to the common electrode is larger than the desired voltage difference, that is, the voltage difference applied on both sides of the liquid crystal molecules is larger than the desired voltage difference. Therefore, the discontinuity of the voltage difference applied on both sides of the liquid crystal molecules is generated between two adjacent frames.

SUMMARY

An embodiment of the invention provides a TFT-LCD array substrate. The thin film transistor liquid crystal display (TFT-LCD) array substrate, comprising: a plurality of first gate lines and a plurality of first data lines, and a plurality of pixel regions defined by intersecting of the first gate lines and the first data lines with each other. Each of the pixel regions comprises a first pixel electrode and a first thin film transistor (TFT), wherein the first gate line is connected with a gate electrode of the first TFT, the first TFT is connected with the first pixel electrode to control a display voltage applied on the first pixel electrode, and a second TFT and a second pixel electrode, wherein the second TFT is connected with the second pixel electrode to control a common voltage applied on the second pixel electrode. The first pixel electrode and the second pixel electrode form the voltage difference to drive liquid crystal molecules, and the first TFT and the second TFT are turned on or off simultaneously.

Another embodiment of the invention provides a method of manufacturing a TFT-LCD array substrate. The method comprises:

Step 1 of forming a first gate line, a first data line, a second pixel electrode, a first source electrode of a first thin film transistor (TFT), a first drain electrode of the first TFT, a first gate electrode of the first TFT, a first TFT channel, a second data line, a second source electrode of a second TFT, a second drain electrode of the second TFT, a second gate electrode of the second TFT, a second TFT channel in each pixel region on a substrate, wherein a pixel region is defined by intersecting of the first gate line and the first data line with each other, and the first gate line is connected with the first gate electrode;

Step 2 of depositing a passivation layer on the substrate after the Step 1 and forming via holes in the passivation layer; and Step 3 of depositing a transparent conductive film on the substrate after the Step 2 and forming a first pixel electrode, wherein the second TFT is connected with the second pixel electrode through one via hole of the passivation layer, and the first TFT is connected with the first pixel electrode through another via hole of the passivation layer.

Furthermore, further another embodiment of the invention provides a liquid crystal display panel. The liquid crystal display panel comprises an array substrate, a color filter substrate and a liquid crystal layer provided between the array substrate and the color filter substrate. A first pixel electrode and a first TFT is provided on the array substrate, and the first TFT is connected with the first pixel electrode. The liquid crystal display panel further comprises a second TFT and a second pixel electrode provided on the array substrate or the color filter substrate, the second TFT is connected with the second pixel electrode, and the first TFT and the second TFT are simultaneously turned on or off.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1b is a sectional view taken along A1-A1 in FIG. 1a;

FIG. 1c is a sectional view taken along B1-B1 in FIG. 1a;

FIG. 3b is a sectional view taken along A2-A2 in FIG. 3a;

FIG. 3c is a sectional view taken along B2-B2 in FIG. 3a;

FIG. 4b is a sectional view taken along A3-A3 in FIG. 4a;

FIG. 4c is a sectional view taken along B3-B3 in FIG. 4a;

FIG. 5b is a sectional view taken along A4-A4 in FIG. 5a;

FIG. 5c is a sectional view taken along B4-B4 in FIG. 5a;

FIG. 7b is a sectional view taken along C1-C1 in FIG. 7a;

FIG. 8b is a sectional view taken along C2-C2 in FIG. 8a;

FIG. 9b is a sectional view taken along C3-C3 in FIG. 9a;

FIG. 10b is a sectional view taken along C4-C4 in FIG. 10a;

DESCRIPTION OF THE EMBODIMENTS

A TFT-LCD array substrate provided in the embodiments of the invention comprises a plurality of first gate lines and a plurality of first data lines, and a plurality of pixel regions are defined by intersecting of the first gate lines and the first data lines with each other. A first pixel electrode and a first TFT are formed in each of the pixel regions, and a second TFT and a second pixel electrode are further comprised in each of the pixel regions. The first gate line is connected with the gate electrode of the first TFT, the first TFT is connected with the first pixel electrode to control the display voltage applied on the first pixel electrode, the second TFT is connected with the second pixel electrode to control the common voltage applied on the second pixel electrode, the first pixel electrode and the second pixel electrode form the voltage difference to drive the reversion of the liquid crystal molecules, and the first TFT and the second TFT are turned on or off simultaneously.

The embodiment of the invention will be described in detail hereinafter with reference to the accompanying drawings.

Figure 1A:
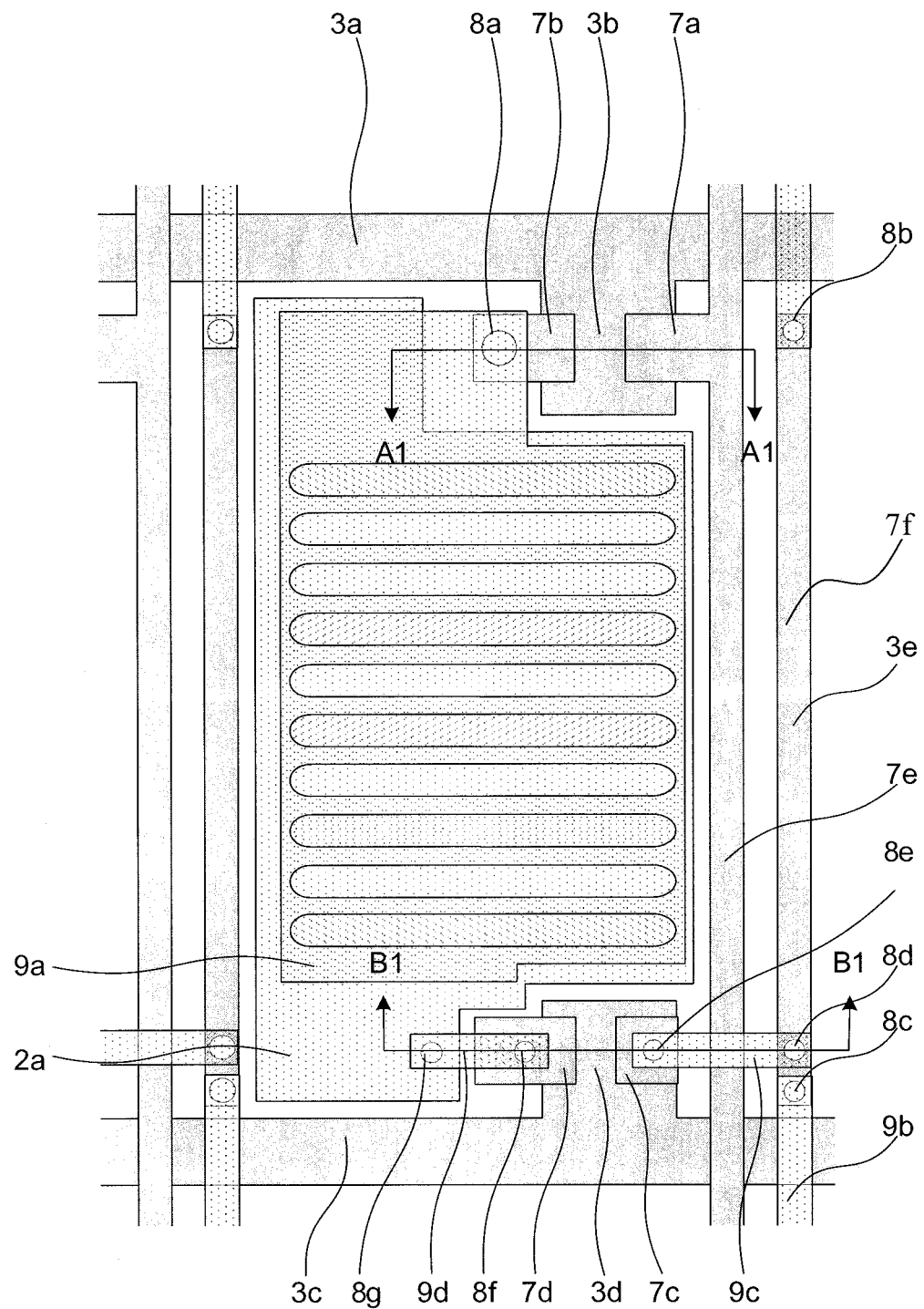
FIG. 1a is a plan view showing a TFT-LCD array substrate according to a first embodiment of the invention.
Figure 1B:
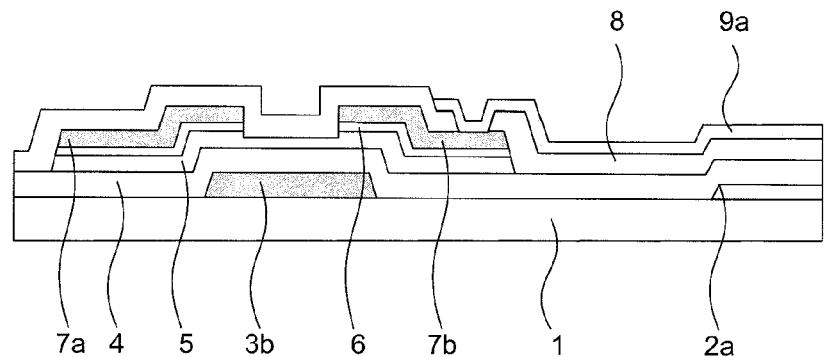

FIG. 1a is a plan view showing a TFT-LCD array substrate according to a first embodiment of the invention; FIG. 1b is a sectional view taken along A1-A1 in FIG. 1a; and FIG. 1c is a sectional view taken along B1-B1 in FIG. 1a.

Figure 1C:
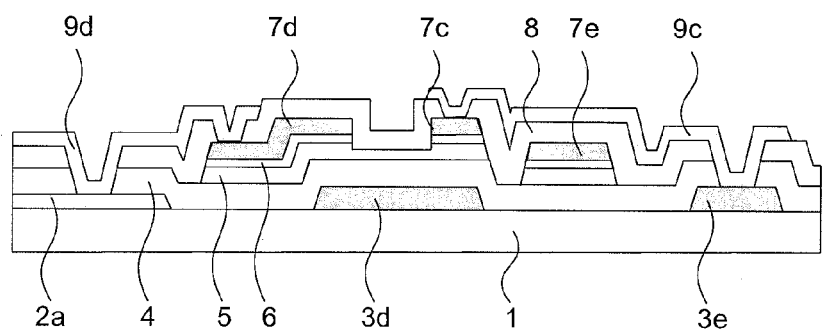

As shown in FIG. 1a-1c, the TFT-LCD array substrate in this embodiment comprises the pixel region defined by the first data line 7e and the first gate line 3a, the pixel region comprises the first pixel electrode 9a and the first TFT, and the first data line 7e supplies the data signal to the first pixel electrode 9a through the first TFT. The TFT-LCD array substrate further comprises the second data line 7f formed by connecting the second data line segments 3e through a first connection bar 9b, the region defined by the second data line 7f and the second gate line 3c comprises the second pixel electrode 2a and the second TFT, and the second data line 7f supplies the common voltage of common electrode to the second pixel electrode through the second TFT. The first TFT comprises a first gate electrode 3b, a first source electrode 7a and a first drain electrode 7b, the first TFT is controlled to be turned on or off by the first gate line 3a through the first gate electrode 3b, the first drain electrode 7b is connected with the first pixel electrode 9a, and the first source electrode 7a is connected with the first data line 7e. The second TFT comprises a second gate electrode 3d, a second source electrode 7c and a second drain electrode 7d, the second TFT is controlled to be turned on or off by the second gate line 3c through the second gate electrode 3d, the second drain electrode 7d is connected with the second pixel electrode 2a, and the second source electrode 7c is connected with the second data line 7f. A plurality of slits are provided in the first pixel electrode 9a, and thus the horizontal electric field parallel to the array substrate is formed between the first pixel electrode 9a and the second pixel electrode 2a to drive the rotation of the liquid crystal molecules. The overlapping portion between the first pixel electrode 9a and the second pixel electrode 2a provides the storage capacitance to maintain the voltage on the first pixel electrode 9a.

In the first embodiment, the second pixel electrode acting as a common electrode is individually provided in each of the pixel regions rather than an integral common electrode is formed on the entire substrate. In addition, in the first embodiment, each of the second pixel electrodes is controlled by a second TFT, the same gate driving signals are input to the first gate line and the second gate line so that the first TFT and the second TFT are simultaneously turned on or off. The first data line supplies the data signal to the first pixel electrode and the second data line supplies the common voltage of common electrode to the second pixel electrode. Because of the existence of the feed through voltage, both of the voltage applied on the first pixel electrode and the voltage applied on the second pixel electrode are decreased. Since the gate voltages of the first TFT and the second TFT are equal to each other and the parameters such as Cgd, Cst and Clc for calculating the feed through voltage are all equal for the first pixel electrode and the second pixel electrode, the first pixel electrode and the second pixel electrode have the same feed through voltages according to the above-described formula of the feed through voltage, and thus the voltage difference between the first pixel electrode and the second pixel electrode is equal to the desired voltage difference. Therefore, during the period of two adjacent frames, the voltage difference applied on both sides of the liquid crystal molecules is equal to the desired voltage difference. In this way, the discontinuity of the voltage difference applied on both sides of the liquid crystal molecules can be prevented between the two adjacent frames and thus the display quality can be improved.

Figure 14:
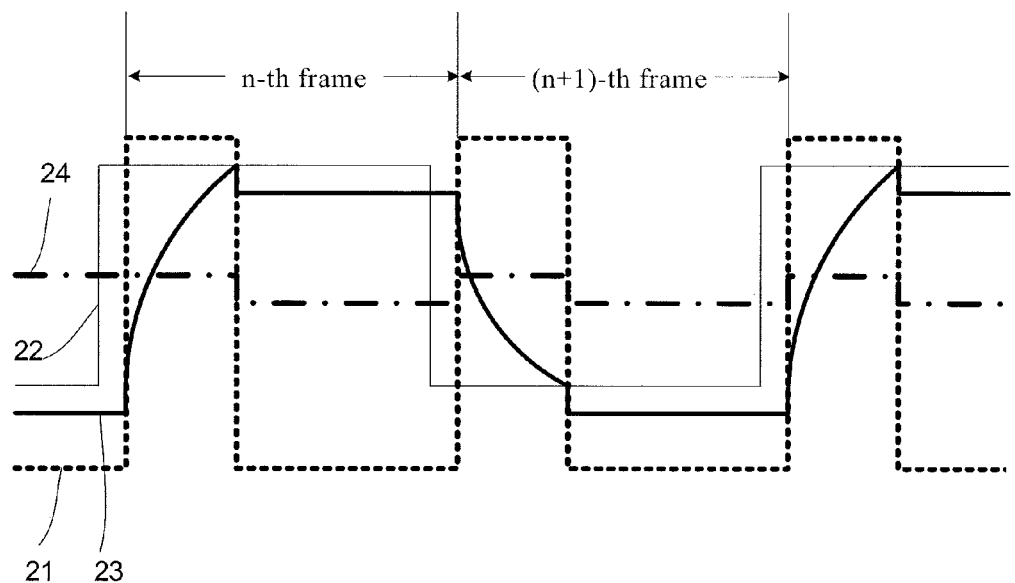
FIG. 14 is a diagram showing the occurrence of the feed through voltage on the first pixel electrode and the second pixel electrode of the TFT-LCD array substrate in the invention.

FIG. 14 is a diagram showing the occurrence of the feed through voltage on the first pixel electrode and the second pixel electrode of the TFT-LCD array substrate according to the first embodiment of the invention.

During the period of the n-th frame image, the signal 21 input to the first gate electrode and the second gate electrode at the initial stage is at a high level, the first TFT and the second TFT in the pixel region are turned on, and the signal 22 input to the first data line is conducted to the first pixel electrode through the first TFT. Compared with the signal input to the first data line, the signal 23 input to the first pixel electrode is decreased due to existence of the feed through. In addition, the signal of the second data line is input to the second pixel electrode through the second TFT, and the voltage of the signal 24 input to the second pixel electrode is smaller than that of the signal 23 input to the first pixel electrode. Compared with the signal input to the second data line, the signal 24 input to the second pixel electrode is decreased due to existence of the feed through. Because the voltage drop of the signal 23 input to the first pixel electrode is equal to that of the signal 24 input to the second pixel electrode, the voltage difference between the signal 23 input to the first pixel electrode and the signal 24 input to the second pixel electrode becomes equal to the desired voltage difference, that is, the voltage difference applied on both sides of the liquid crystal molecules becomes equal to the desired voltage difference.

During the period of the (n+1)-th frame image, the signal 21 input to the first gate electrode and the second gate electrode at the initial stage is at a high level, the first TFT and the second TFT in the pixel region are turned on, and the signal 22 input to the first data line is conducted to the first pixel electrode through the first TFT. Compared with the signal input to the first data line, the signal 23 input to the first pixel electrode is decreased due to the feed through. In addition, the signal of the second data line is input to the second pixel electrode through the second TFT, and the voltage of the signal 24 input to the second pixel electrode is larger than that of the signal 23 input to the first pixel electrode. Compared with the signal input to the second data line, the signal 24 input to the second pixel electrode is decreased due to the feed through. Because the voltage drop of the signal 23 input to the first pixel electrode is equal to that of the signal 24 input to the second pixel electrode, the voltage difference between the signal 23 input to the first pixel electrode and the signal 24 input to the second pixel electrode becomes equal to the desired voltage difference, that is, the voltage difference applied on both sides of the liquid crystal molecules becomes equal to the desired voltage difference. In this way, the discontinuity of the voltage difference applied on both sides of the liquid crystal molecules can be prevented between adjacent frames and thus the display quality can be improved.

Specifically, in the first embodiment, the first gate electrode 3b, the first gate line 3a, the second gate electrode 3d, the second gate line 3c and the second data line segment 3e are provided in a same layer, that is, they are formed in a same patterning process. The first source electrode 7a, the first drain electrode 7b, the second source electrode 7c, the second drain electrode 7d and the first data line 7e are provided in a same layer, that is, they are formed by a same patterning process. One end of the first source electrode 7a is positioned above the first gate electrode 3b, and the other end thereof is connected with the first data line 7e; one end of the first drain electrode 7b is positioned above the first gate electrode 3b, provided opposite to the first source electrode 7a and connected with the first pixel electrode 9a through a first via hole 8a. One end of the second source electrode 7c is positioned above the second gate electrode 3d and connected with the second data line segment 3e through a second connection bar 9c, a fifth via hole 8e and a fourth via hole 8d. One end of the second drain electrode 7d is positioned above the second gate electrode 3d and provided opposite to the second source electrode 7c, and the other end thereof is connected with the second pixel electrode 2a through a seventh via hole 8g or connected with the second pixel electrode 2a through a third connection bar 9d, a sixth via hole 8f and the seventh via hole 8g. The adjacent second data line segments 3e are connected by the first connection bar 9b to form the second data line 7f.

FIGS. 2 to 5c are diagrams showing the manufacture process of the TFT-LCD array substrate according to the first embodiment of the invention. Hereinafter, the patterning process typically comprises applying a photoresist, masking, exposing and developing photoresist, etching by using a photoresist pattern, removing the photoresist and the like. For example, a positive photoresist is used as the photoresist.

Figure 2:
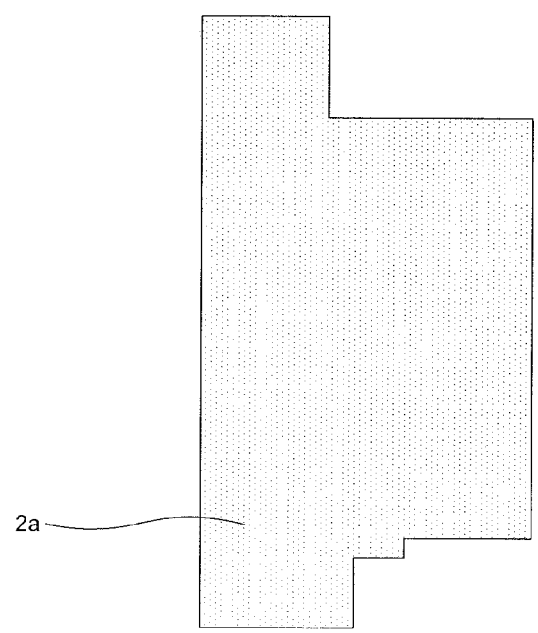
FIG. 2 is a plan view showing the TFT-LCD array substrate according to the first embodiment of the invention after a first patterning process.

FIG. 2 is a plan view showing the TFT-LCD array substrate according to the first embodiment of the invention after a first patterning process. First, a transparent conductive film with a thickness of 30-60 nm is deposited on a substrate 1 (for example, a glass substrate or a quartz substrate) by a magnetron sputtering method or a thermal evaporation method. The transparent conductive film may be formed by indium tin oxide (ITO), indium zinc oxide (IZO) and the like, for example. Then, the second pixel electrode 2a is formed by the first patterning process.

Figure 3A:
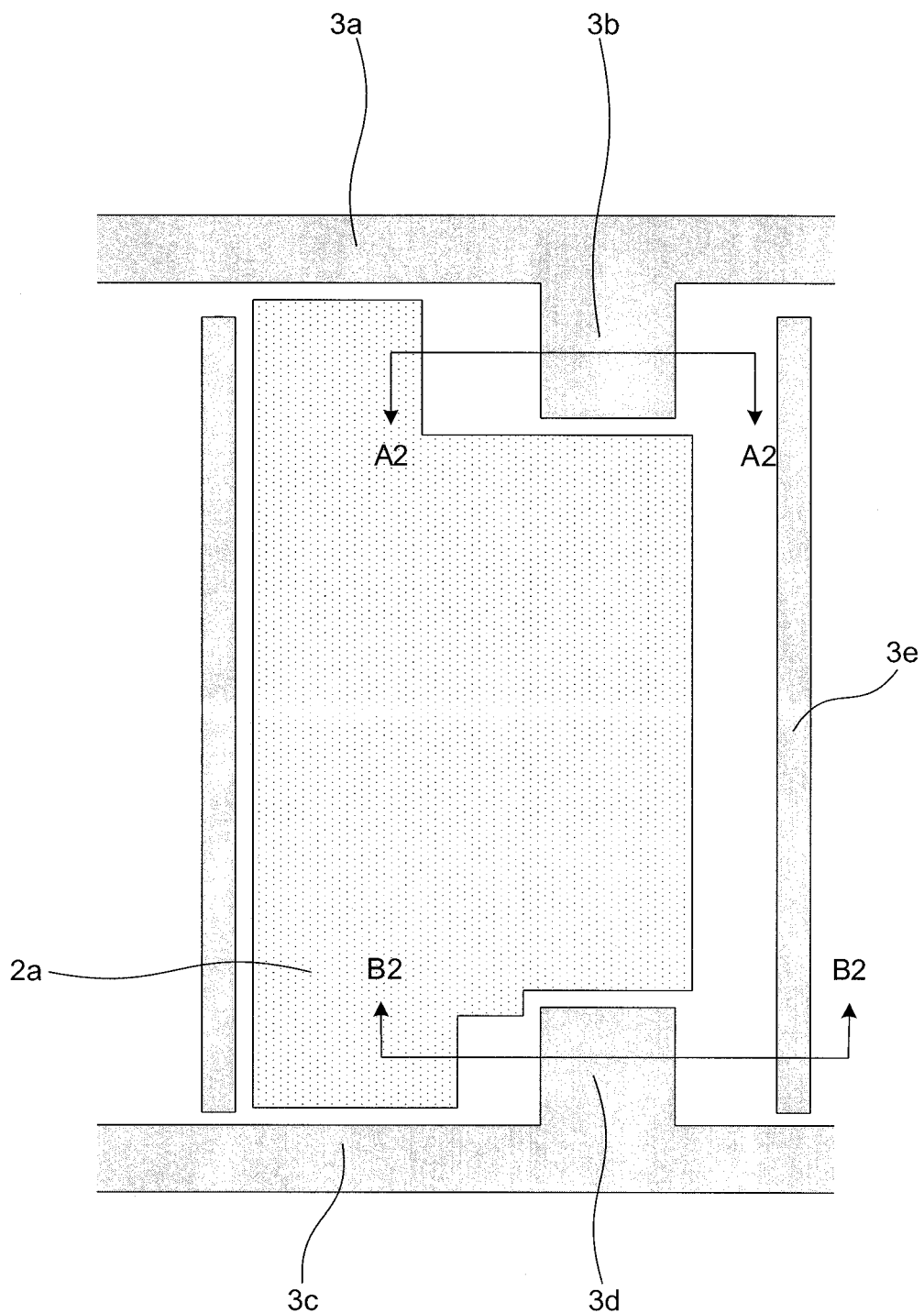
FIG. 3a is a plan view showing the TFT-LCD array substrate according to the first embodiment of the invention after a second patterning process.
Figure 3B:
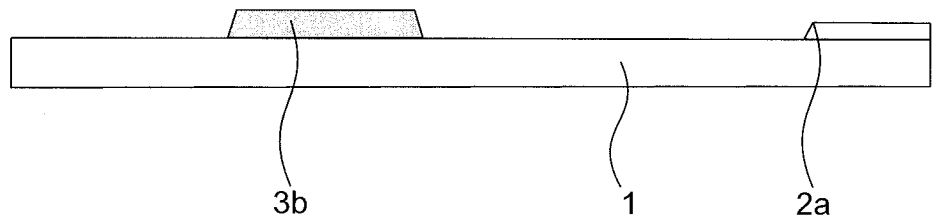
Figure 3C:
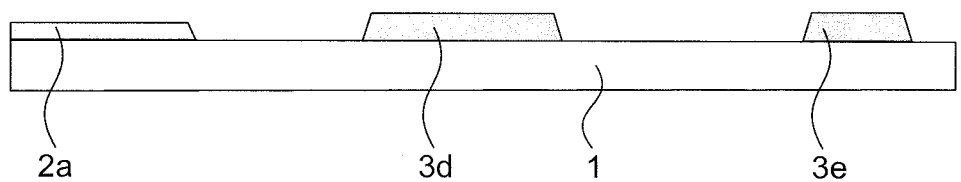

FIG. 3a is a plan view showing the TFT-LCD array substrate according to the first embodiment of the invention after a second patterning process, FIG. 3b is a sectional view taken along A2-A2 in FIG. 3a, and FIG. 3c is a sectional view taken along B2-B2 in FIG. 3a.

On the substrate 1 with the pattern shown in FIG. 2, a gate metal film with a thickness of 50-60 nm is deposited by a magnetron sputtering method or a thermal evaporation method. The gate metal film may be formed by chromium (Cr), tungsten (W), titanium (Ti), tantalum (Ta), molybdenum (Mo), aluminum (Al), copper (Cu) and the like, for example. Then, the second patterning process is performed to form the first gate line 3a, the first gate electrode 3b, the second gate line 3c, the second gate electrode 3d and the second data line segment 3e.

Figure 4A:
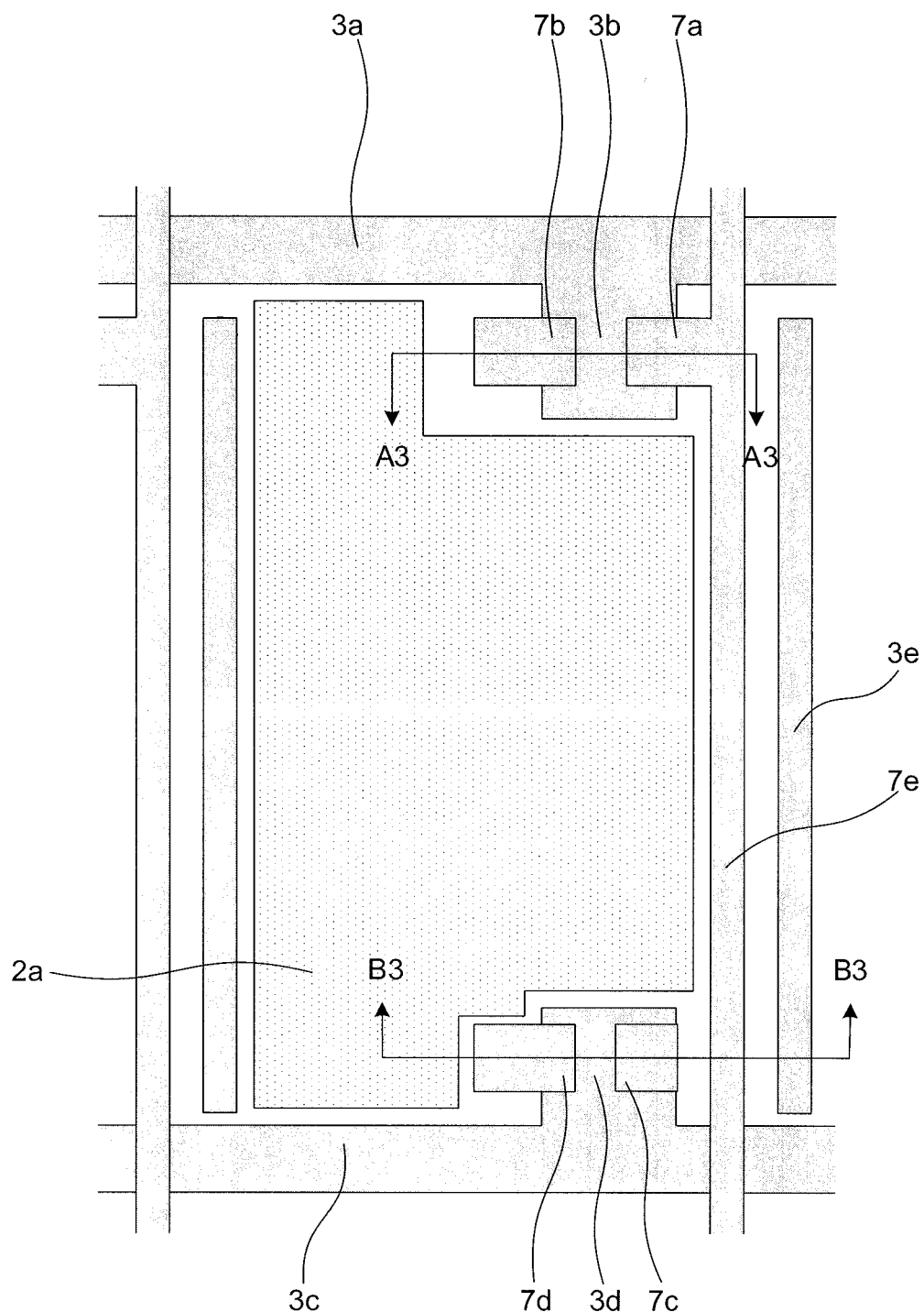
FIG. 4a is a plan view showing the TFT-LCD array substrate according to the first embodiment of the invention after a third patterning process.
Figure 4B:
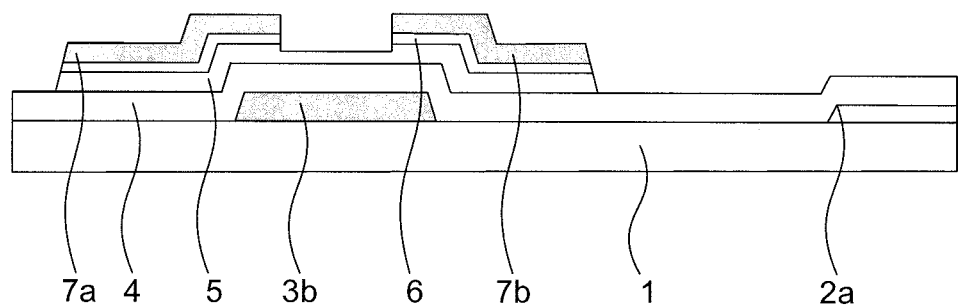
Figure 4C:
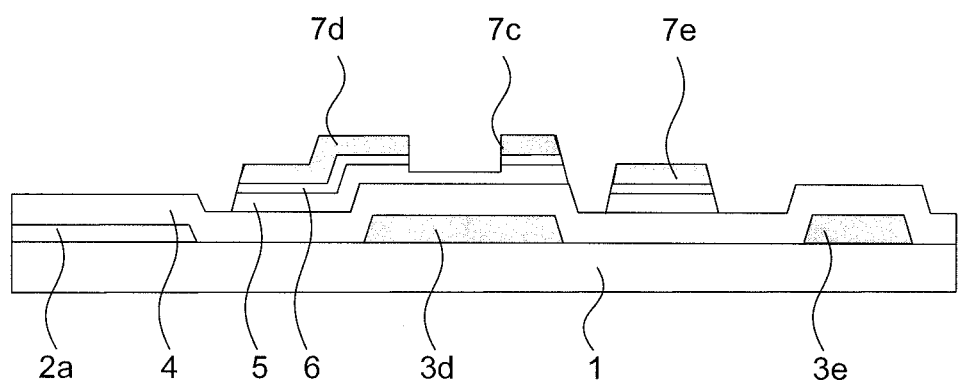

FIG. 4a is a plan view showing the TFT-LCD array substrate according to the first embodiment of the invention after a third patterning process, FIG. 4b is a sectional view taken along A3-A3 in FIG. 4a, and FIG. 4c is a sectional view taken along B3-B3 in FIG. 4a.

By using a plasma enhanced chemical vapor deposition (PECVD) method, a gate insulating film 4 with a thickness of 200-400 nm and an active layer (comprising a semiconductor layer 5 and a doped semiconductor layer 6 as an ohmic contact layer) are sequentially deposited. Then, a source/drain metal film with a thickness of 50-250 nm is deposited by a magnetron sputtering method or a thermal evaporation method. For example, the gate insulating film 4 may be formed by oxides, nitrides, oxynitride, or any combination thereof, and accordingly the source gas for the gate insulating film 4 may be a mixture of $SiH_4$ and nitrogen ($N_2$), or a mixture of $SiH_2Cl_2$, $NH_3$ and $N_2$. The source gas for the active layer may be a mixture of $SiH_4$ and hydrogen ($H_2$), or a mixture of $SiH_2Cl_2$ and $H_2$. For example, the source/drain metal film may be formed by Cr, W, Ti, Ta, Mo, Al, Cu and the like or an alloy thereof. Then, the third patterning process is performed to form the first source electrode 7a, the first drain electrode 7b, the second source electrode 7c, the second drain electrode 7d and the first data line 7e. At the same time, a first TFT channel and a second TFT channel are formed.

Furthermore, the third patterning process may be performed by using a multi-step etching process. Similar to the process of forming a data line, a source electrode, a drain electrode and a TFT channel region by using a four-mask process, the following steps can be used. First, a photoresist layer is coated on the source/drain metal film, and the photoresist layer is exposed by using a half-tone mask or a gray-tone mask so that a completely exposed region, an unexposed region and a partially exposed region are formed in the photoresist layer. The unexposed region corresponds to the regions of the first data line, the first source electrode, the first drain electrode, the second source electrode, and the second drain electrode; the partially exposed region corresponds to the regions of the first TFT channel and the second TFT channel; and the completely exposed region corresponds to the regions other than the above-described regions. After the developing process, the thickness of the photoresist in the unexposed region substantially is not changed so that the photoresist-completely-retained region is formed, the photoresist in the completely exposed region is completely removed so that the photoresist-completely-removed region is formed, and the thickness of the photoresist in the partially exposed region is thinned so that the photoresist-partially-retained region is formed. By using a first etching process, the source/drain metal film, the doped semiconductor layer and the semiconductor layer in the photoresist-completely-removed region are etched away to form the first data line, the first source electrode, the first drain electrode, the second source electrode and the second drain electrode. The photoresist in the photoresist-partially-retained region is removed to expose the source/drain metal film in this region by using an ashing process. In the photoresist-partially-retained region, the source/drain metal film and the doped semiconductor layer are etched away and the semiconductor layer is partially etched in the thickness direction thereof by using a second etching process to form the first TFT channel and the second TFT channel. Then, the remaining photoresist is completely removed, and the third patterning process of the TFT-LCD substrate in this embodiment is completed. After the third patterning process, one end of the first source electrode 7a is positioned above the first gate electrode 3b and the other end thereof is connected with the first data line 7e. One end of the first drain electrode 7b is positioned above the first gate electrode 3b and provided opposite to the first source electrode 7a. The doped semiconductor layer in the TFT channel region between the first source electrode 7a and the first drain electrode 7b is etched away to expose the semiconductor layer. The second source electrode 7c is positioned above the second gate electrode 3d, and the second source electrode 7c and the second data line segment 3e are respectively provided on both sides of the first data line 7e. One end of the second drain electrode 7d is positioned above the second gate electrode 3d and provided opposite to the second source electrode 7c. The doped semiconductor layer in the TFT channel region between the second source electrode 7c and the second drain electrode 7d is etched away to expose the semiconductor layer. In addition, the doped semiconductor layer 6 and the semiconductor layer 5 are remained below the first data line 7e, the first source electrode 7a, the first drain electrode 7b, the second source electrode 7c and the second drain electrode 7d.

Figure 5A:
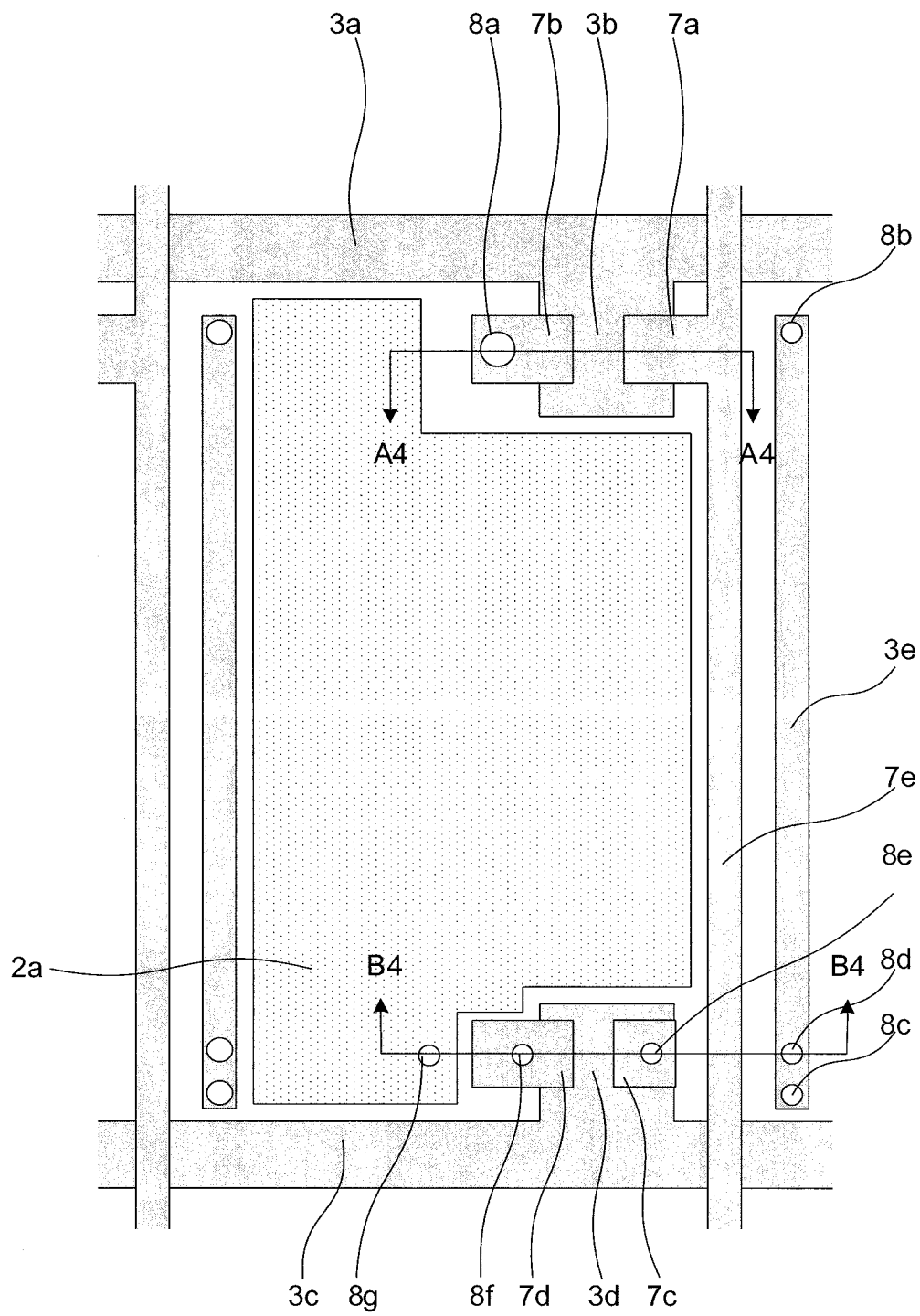
FIG. 5a is a plan view showing the TFT-LCD array substrate according to the first embodiment of the invention after a fourth patterning process.
Figure 5B:
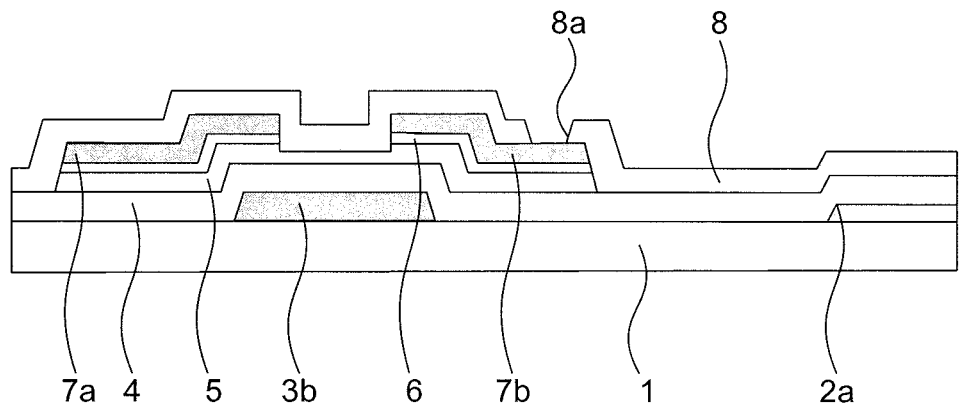
Figure 5C:
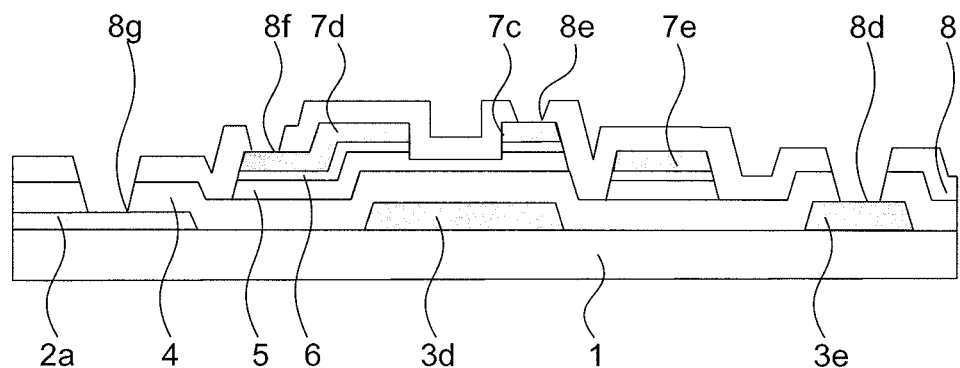

FIG. 5a is a plan view showing the TFT-LCD array substrate according to the first embodiment of the invention after a fourth patterning process, FIG. 5b is a sectional view taken along A4-A4 in FIG. 5a, and FIG. 5c is a sectional view taken along B4-B4 in FIG. 5a.

On the substrate with the pattern shown in FIG. 4a, a passivation layer 8 is deposited by a PECVD method. For example, the passivation layer 8 may be formed by oxides, nitrides, or oxynitride, and accordingly the source gas for the passivation layer 8 may be a mixture of $SiH_4$, $NH_3$ and $N_2$, or a mixture of $SiH_2Cl_2$, $NH_3$ and $N_2$. Then, the passivation layer 8 is patterned by using a normal mask to form the first via hole 8a, the second via hole 8b, the third via hole 8c, the fourth via hole 8d, the fifth via hole 8e, the sixth via hole 8f and the seventh via hole 8g. The first via hole 8a is positioned on the first drain electrode 7b, and the passivation layer 8 at the first via hole 8a is etched to expose the surface of the first drain electrode 7b. The second via hole 8b and the third via hole 8c are respectively provided on the upper end portion and the lower end portion of the second data line segment 3e, and the passivation layer 8 and the gate insulating film 4 at the via holes 8b and 8c are etched to expose the second data line segment 3e. The fourth via hole 8d is provided at the position on the lower end portion of the second data line segment 3e opposite to the second source electrode 7c, and the fifth via hole 8e is positioned on the second source electrode 7c. The passivation layer 8 and the gate insulating film 4 at the fourth via hole 8d is etched to expose the second data line segment 3e, and the passivation layer 8 at the fifth via hole 8e is etched to expose the second source electrode 7c. The sixth via hole 8f is positioned on the second drain electrode 7d, and the seventh via hole 8g is provided at the position on the second pixel electrode 2a opposite to the sixth via hole 8f. The passivation layer 8 at the sixth via hole 8f is etched to expose the second drain electrode 7b, and the passivation layer 8 and the gate insulating film 4 at the seventh via hole 8g are etched to expose the second pixel electrode 2a. In this patterning process, gate pad via holes of in a gate pad region, data pad via holes in a data pad region and the like can be simultaneously formed. The patterning process for forming the gate pad region and the data pad region has been widely used, and the detail description thereof is omitted for simplicity.

Finally, on the substrate with the pattern shown in FIG. 5a, a second transparent conductive film is deposited by a magnetron sputtering method or a thermal evaporation method.

For example, the second transparent conductive film may be formed by indium tin oxide (ITO), indium zinc oxide (IZO) and the like. The second transparent conductive film is patterned by using a normal mask to form the first pixel electrode 9a, the first connection bar 9b, the second connection bar 9c and the third connection bar 9d in each of the pixel regions, as shown in FIG. 1a-1c. The first pixel electrode 9a in each of the pixel regions is connected with the first drain electrode 7b through the first via hole 8a. The first connection bar 9b is used to connect the second via hole 8b on the second data line segment 3e in one pixel region and the third via hole 8c on the second data line segment 3e in another adjacent pixel region so that the second data line segments 3e in the adjacent pixel regions within a same column can be connected together to form one second data line. The second source electrode 7c is connected with the second data line segment 3c by the second connection bar 9c through the fifth via hole 8e and the fourth via hole 8d. The second drain electrode 7d is connected with the second pixel electrode 2a by the third connection bar 9d through the sixth via hole 8f and the seventh via hole 8g.

Figure 6:
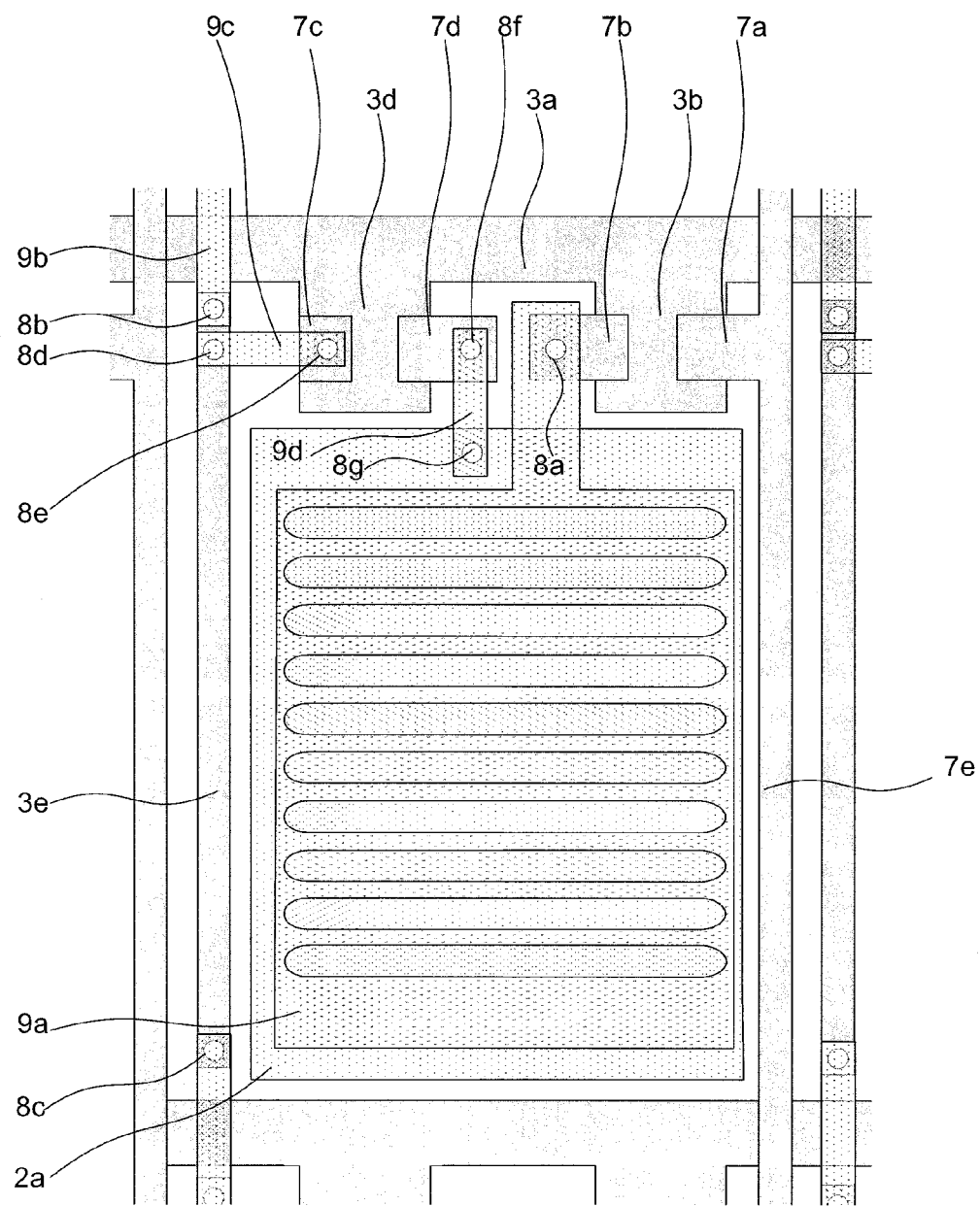
FIG. 6 is a plan view showing a TFT-LCD array substrate according to a second embodiment of the invention.

FIG. 6 is a plan view showing a TFT-LCD array substrate according to a second embodiment of the invention. The second embodiment is different from the first embodiment as follows. In the second embodiment, the first gate line 3a is shared by the first TFT and the second TFT, and the first gate line 3a is connected with the first gate electrode 3b and the second gate electrode 3d, respectively. However, in the first embodiment, the first gate electrode 3b of the first TFT is connected with the first gate line 3a, and the second gate electrode 3d of the second TFT is connected with the second gate line 3c.

During manufacturing the TFT-LCD array substrate according to the second embodiment, after the gate metal film is deposited on the substrate with the second pixel electrode 2a, the first gate line 3a, the first gate electrode 3b, the second gate electrode 3d and the second data line segments 3e are formed by the second patterning process. The subsequent processes in the second embodiment are similar to that in the first embodiment, and the detail description thereof is omitted for simplicity.

In the second embodiment, the first TFT and the second TFT share one gate line, and therefore the aperture ratio of the liquid crystal panel can be improved. In the first and second embodiments of the invention, the first data line and the second data line are not formed in a same patterning process and the first data line and the second data line are formed in different layers, and thus the interference between the first data line and the second data line can be decreased. Furthermore, it should be noted that the second data line also can be provided in the same layer with the first data line. Even though the interference may occur between the first data line and the second data line, the discontinuity of the voltage difference applied on both sides of the liquid crystal molecules can be prevented between adjacent frames and display quality can be improved.

Figure 7A:
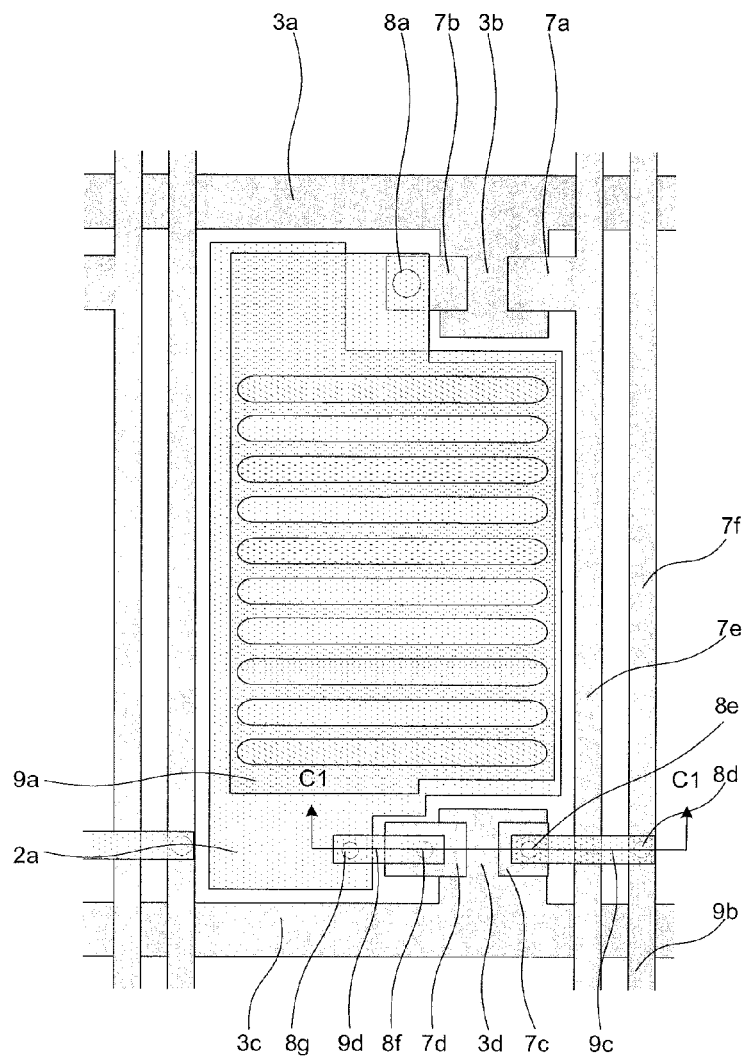
FIG. 7a is a plan view showing a TFT-LCD array substrate according to a third embodiment of the invention.
Figure 7B:
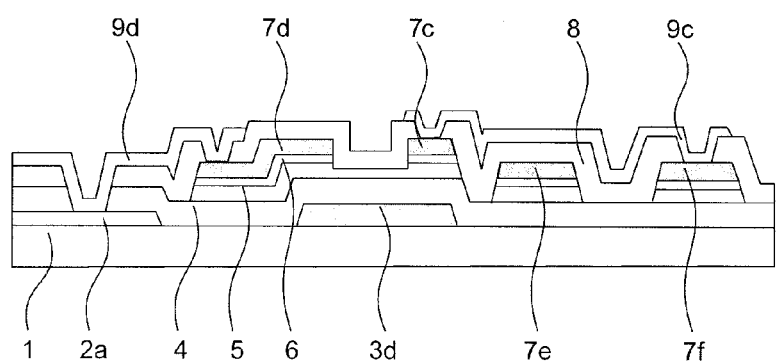

FIG. 7a is a plan view showing a TFT-LCD array substrate according to a third embodiment of the invention and FIG. 7b is a sectional view taken along C1-C1 in FIG. 7a. The third embodiment is different from the first embodiment in that the second data line and the first data line are formed in a same patterning process.

Since the manufacture processes of the first TFT and the first data line in the third embodiment are similar to that in the first embodiment, the manufacture processes of the second TFT and the second data line are focused in the third embodiment.

First, the second pixel electrode 2a is formed on the substrate by the first patterning process similar to that of the first embodiment.

Figure 8A:
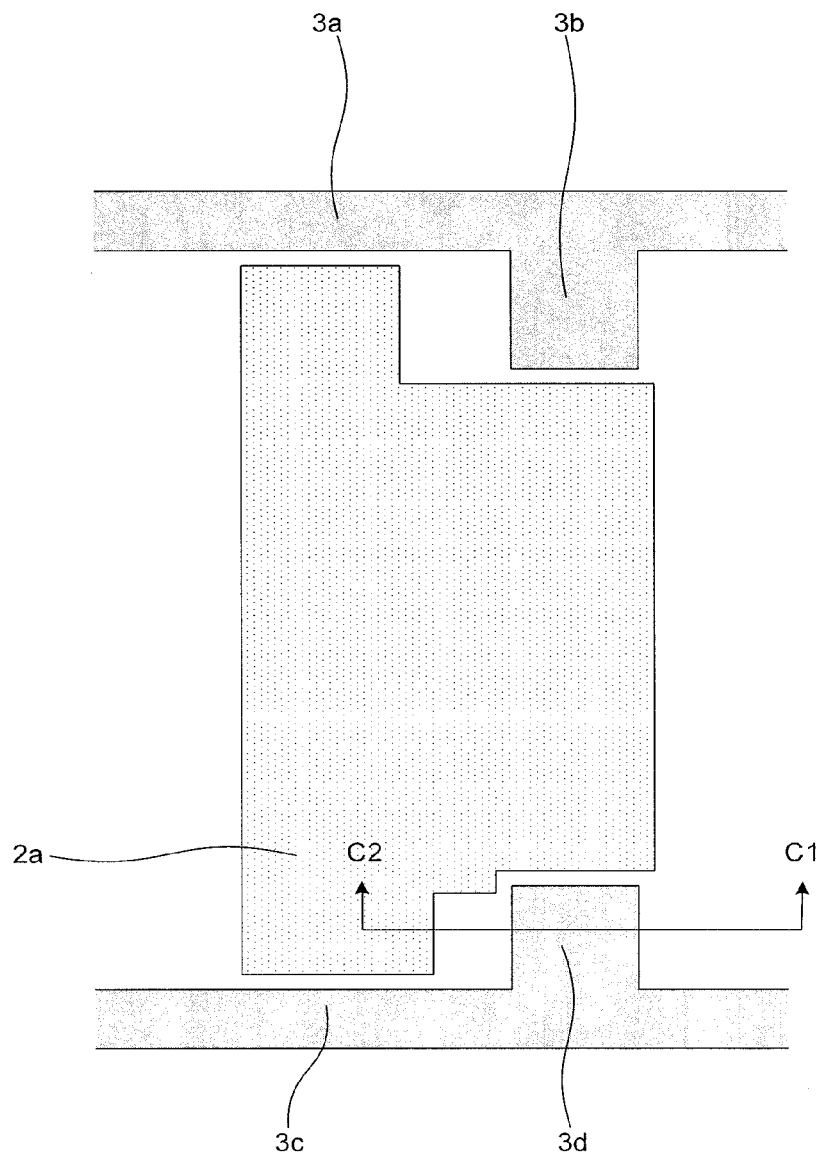
FIG. 8a is a plan view showing the TFT-LCD array substrate according to the third embodiment of the invention after a second patterning process.
Figure 8B:
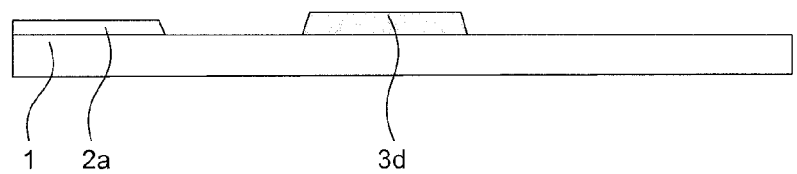

FIG. 8a is a plan view showing the TFT-LCD array substrate according to the third embodiment of the invention after a second patterning process and FIG. 8b is a sectional view taken along C2-C2 in FIG. 8a.

On the substrate 1 with the second pixel electrode 2a, the gate metal film with a thickness of 50-60 nm is deposited by a magnetron sputtering method or a thermal evaporation method. The gate metal film may be formed by chromium (Cr), tungsten (W), titanium (Ti), tantalum (Ta), molybdenum (Mo), aluminum (Al), copper (Cu) and the like, for example. Then, the second patterning process is performed to form the first gate line 3a, the first gate electrode 3b, the second gate line 3c and the second gate electrode 3d.

Figure 9A:
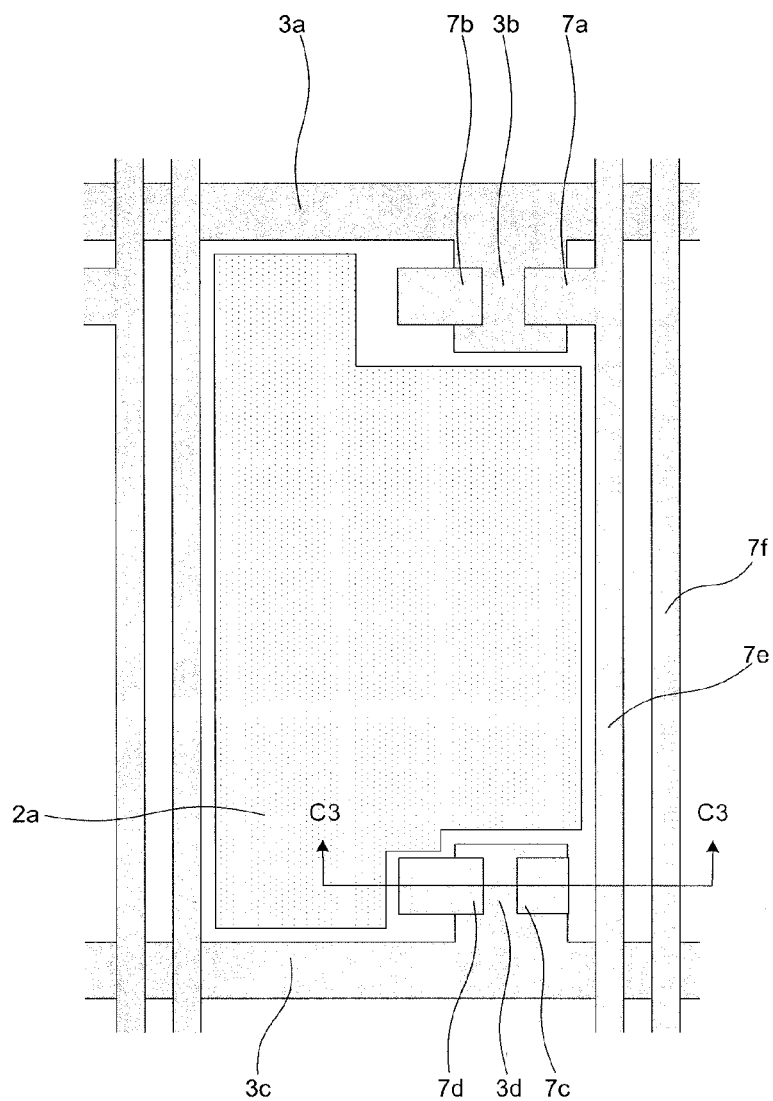
FIG. 9a is a plan view showing the TFT-LCD array substrate according to the third embodiment of the invention after a third patterning process.
Figure 9B:
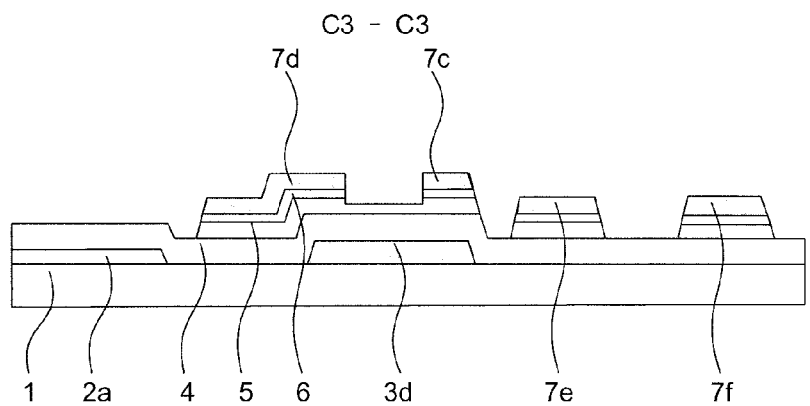

FIG. 9a is a plan view showing the TFT-LCD array substrate according to the third embodiment of the invention after a third patterning process and FIG. 9b is a sectional view taken along C3-C3 in FIG. 9a.

By using a PECVD method, the gate insulating film 4 with a thickness of 200-400 nm and the active layer (comprising the semiconductor layer 5 and the doped semiconductor layer 6) are sequentially deposited. Then, the source/drain metal film with a thickness of 50-250 nm is deposited by a magnetron sputtering method or a thermal evaporation method. By using the third patterning process, the first source electrode 7a, the first drain electrode 7b, the second source electrode 7c, the second drain electrode 7d, the first data line 7e and the second data line 7f are formed. At the same time, the first TFT channel and the second TFT channel are formed.

Furthermore, the third patterning process in this embodiment may be performed by using a multi-step etching process. Similar to the process of forming the data line, the source electrode, the drain electrode and the TFT channel region by using a four-mask process, the following steps are comprised. First, a photoresist layer is coated on the source/drain metal film, and the photoresist layer is exposed by using a half-tone mask or a gray-tone mask so that a completely exposed region, an unexposed region and a partially exposed region are formed in the photoresist layer. The unexposed region corresponds to the regions of the first data line, the second data line, the first source electrode, the first drain electrode, the second source electrode, and the second drain electrode; the partially exposed region corresponds to the regions of the first TFT channel and the second TFT channel; and the completely exposed region corresponds to the regions other than the above-described regions. After a developing process, the thickness of the photoresist in the unexposed region substantially is not changed so that the photoresist-completely-retained region is formed, the photoresist in the completely exposed region is completely removed so that the photoresist-completely-removed region is formed, and the thickness of the photoresist in the partially exposed region is thinned so that the photoresist-partially-retained region is formed. By using a first etching process, the source/drain metal film, the doped semiconductor layer and the semiconductor layer in the photoresist-completely-removed region are etched away to form the first data line, the second data line, the first source electrode, the first drain electrode, the second source electrode and the second drain electrode. The photoresist in the photoresist-partially-retained region is removed to expose the source/drain metal film in this region by using an ashing process. In the photoresist-partially-retained region, the source/drain metal film and the doped semiconductor layer are etched away and the semiconductor layer is partially etched in the thickness direction thereof by using a second etching process to form the first TFT channel and the second TFT channel. Then, the remaining photoresist is completely removed, and the third patterning process of the TFT-LCD substrate in this embodiment is completed. After the third patterning process, one end of the first source electrode 7a is positioned above the first gate electrode 3b and the other end thereof is connected with the first data line 7e. One end of the first drain electrode 7b is positioned above the first gate electrode 3b and opposite to the first source electrode 7a. The doped semiconductor layer in the TFT channel region between the first source electrode 7a and the first drain electrode 7b is etched away to expose the semiconductor layer. One end of the second source electrode 7c is positioned above the second gate electrode 3d. One end of the second drain electrode 7d is positioned above the second gate electrode 3d and opposite to the second source electrode 7c. The doped semiconductor layer in the TFT channel region between the second source electrode 7c and the second drain electrode 7d are etched away to expose the semiconductor layer. In addition, the doped semiconductor layer 6 and the semiconductor layer 5 are remained below the first data line 7e, the second data line 7f, the first source electrode 7a, the first drain electrode 7b, the second source electrode 7c and the second drain electrode 7d.

Figure 10A:
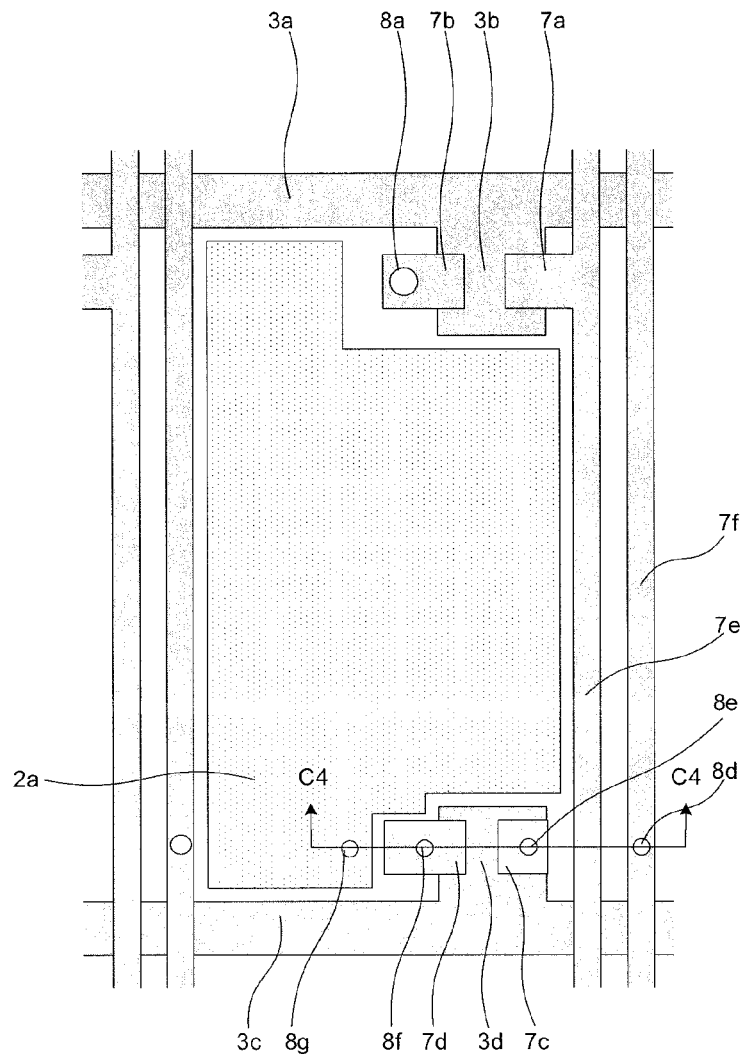
FIG. 10a is a plan view showing the TFT-LCD array substrate according to the third embodiment of the invention after a fourth patterning process.
Figure 10B:
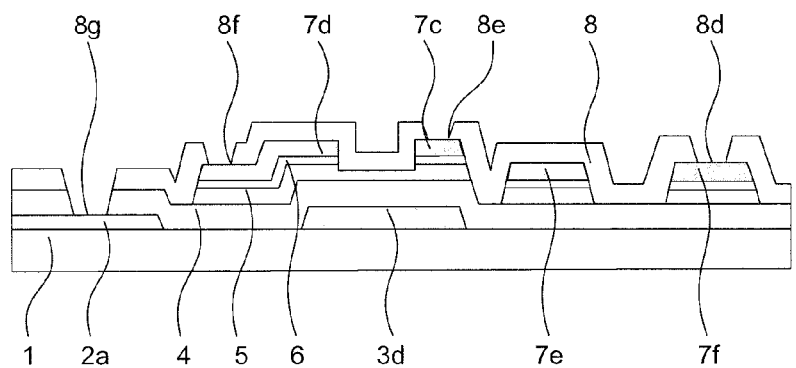

FIG. 10a is a plan view showing the TFT-LCD array substrate according to the third embodiment of the invention after a fourth patterning process and FIG. 10b is a sectional view taken along C4-C4 in FIG. 10a.

On the substrate with the pattern shown in FIG. 9a, the passivation layer 8 is deposited by a PECVD method. Then, the passivation layer 8 is patterned by using a normal mask to form the first via hole 8a, the fourth via hole 8d, the fifth via hole 8e, the sixth via hole 8f and the seventh via hole 8g. The first via hole 8a is positioned on the first drain electrode 7b, and the passivation layer 8 at the first via hole 8a is etched to expose the surface of the first drain electrode 7b. The fourth via hole 8d is provided at the position on the lower end portion of the second data line segment 3e opposite to the second source electrode 7c, and the fifth via hole 8e is positioned on the second source electrode 7c. The passivation layer 8 at the fourth via hole 8d is etched to expose the second data line 7f, and the passivation layer 8 at the fifth via hole 8e is etched to expose the second source electrode 7c. The sixth via hole 8f is positioned on the second drain electrode 7d, and the seventh via hole 8g is provided at the position on the second pixel electrode 2a opposite to the sixth via hole 8f. The passivation layer 8 at the sixth via hole 8f is etched to expose the second drain electrode 7b, and the passivation layer 8 and the gate insulating film 4 at the seventh via hole 8g are etched to expose the second pixel electrode 2a. In this patterning process, the gate pad via hole in the gate pad region, the data pad via hole in the data pad region and the like can be simultaneously formed. The patterning process for forming the gate pad region and the data pad region has been widely used, and the detail description thereof is omitted for simplicity.

Finally, on the substrate with the pattern shown in FIG. 10a, the second transparent conductive film is deposited by a magnetron sputtering method or a thermal evaporation method. The second transparent conductive film is patterned by using a normal mask to form the first pixel electrode 9a, the second connection bar 9c and the third connection bar 9d in each of the pixel regions, as shown in FIGS. 7a and 7b. The first pixel electrode 9a in each of the pixel regions is connected with the first drain electrode 7b through the first via hole 8a. The second source electrode 7c is connected with the second data line 7f by the second connection bar 9c through the fifth via hole 8e and the fourth via hole 8d. The second drain electrode 7d is connected with the second pixel electrode 2a by the third connection bar 9d through the sixth via hole 8f and the seventh via hole 8g.

In the third embodiment, the first TFT and the second TFT may share one gate line, and both of the first gate electrode and the second gate electrode may be connected with the first gate line. This can be carried out in a way similar to that in the second embodiment, and the detail description thereof is omitted for simplicity.

In the above embodiments of the invention, the active layer, the source electrode and the drain electrode of the TFT and the TFT channel are formed in a same patterning process. However, the invention may be implemented by increasing or decreasing the number of the patterning processes, selecting different materials or material combinations. For example, during the manufacture process of the TFT-LCD array substrate according the first to third embodiments, the active layer, the source electrode, the drain electrode and the TFT channel may be formed by two patterning processes by using two normal masks. That is, the active layer patterns of the first TFT and the second TFT are formed by one patterning process by using one normal mask, and the first data line, the second data line, the first source electrode, the first drain electrode, the second source electrode, the second drain electrode and the TFT channels are formed by another patterning process by using another normal mask. The detail description of the above manufacture process is omitted for simplicity.

In the above first and second embodiment, the first patterning process and the second patterning process can be combined into one patterning process. That is, the second pixel electrode, the second gate line, the second gate electrode, the first gate line, the first gate electrode and the second data line may be formed by a same patterning process, and the second pixel electrode, the first gate line and the second gate line may be formed by a same material. In the above third embodiment, the second pixel electrode, the second gate line, the second gate electrode, the first gate line and the first gate electrode may be formed by a same patterning process, and the second pixel electrode, the first gate line and the second gate line may be formed by a same material.

Figure 11:
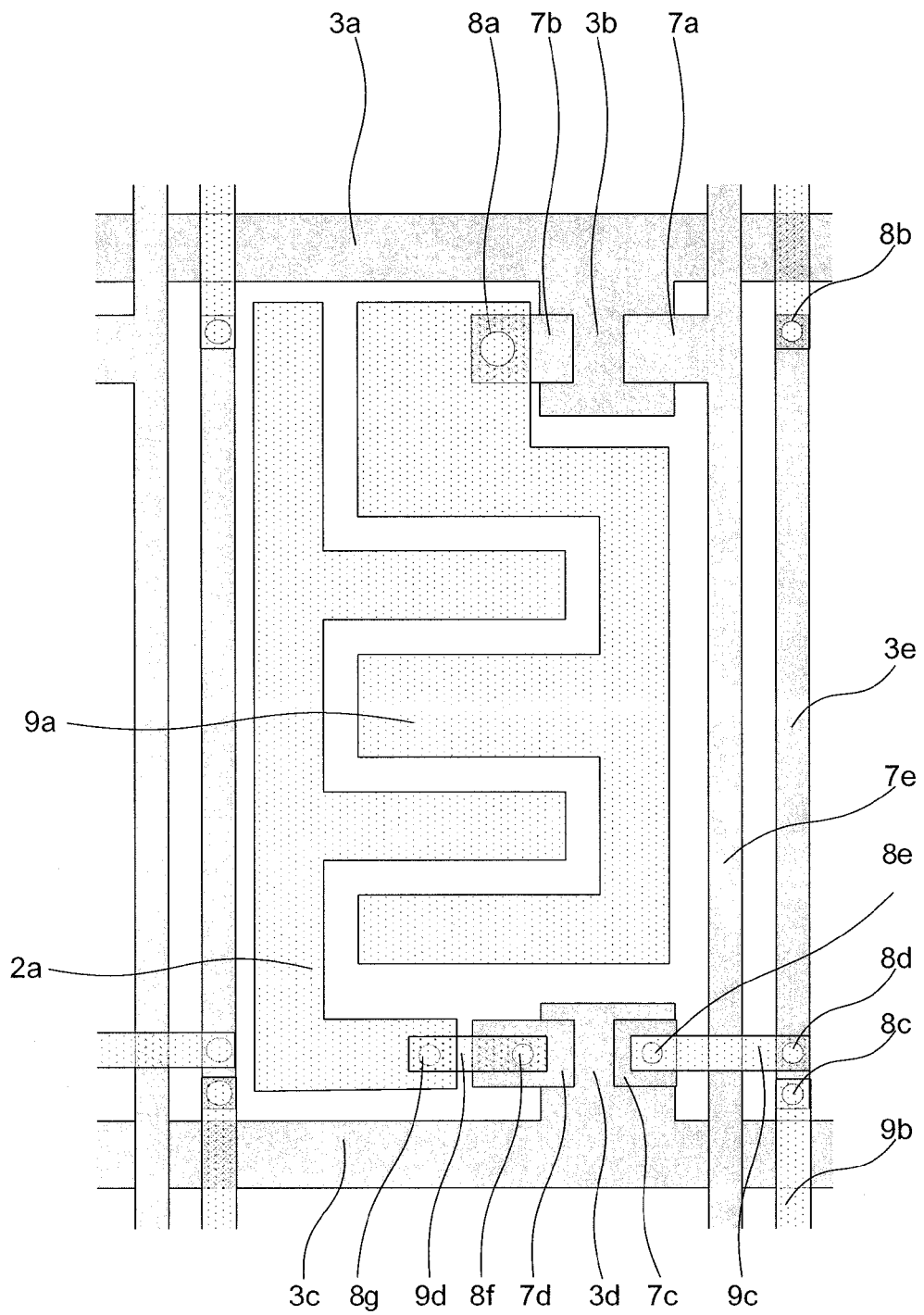
FIG. 11 is a plan view showing a TFT-LCD array substrate according to a fourth embodiment of the invention.

FIG. 11 is a plan view showing a TFT-LCD array substrate according to a fourth embodiment of the invention. The TFT-LCD shown in FIG. 11 is an in-plane switching type TFT-LCD, the second pixel electrode 2a and the first pixel electrode 9a do not overlap with each other and the horizontal electric field is formed between the second pixel electrode 2a and the first pixel electrode 9a. The manufacture process of the array substrate shown in FIG. 11 is similar to that in the first embodiment, and the second pixel electrode 2a and the first pixel electrode 9a are formed by using transparent conductive materials. The array substrate shown in FIG. 11 is different from that of the first embodiment in that the first pixel electrode and the second pixel electrode are formed by a same patterning process.

Figure 12:
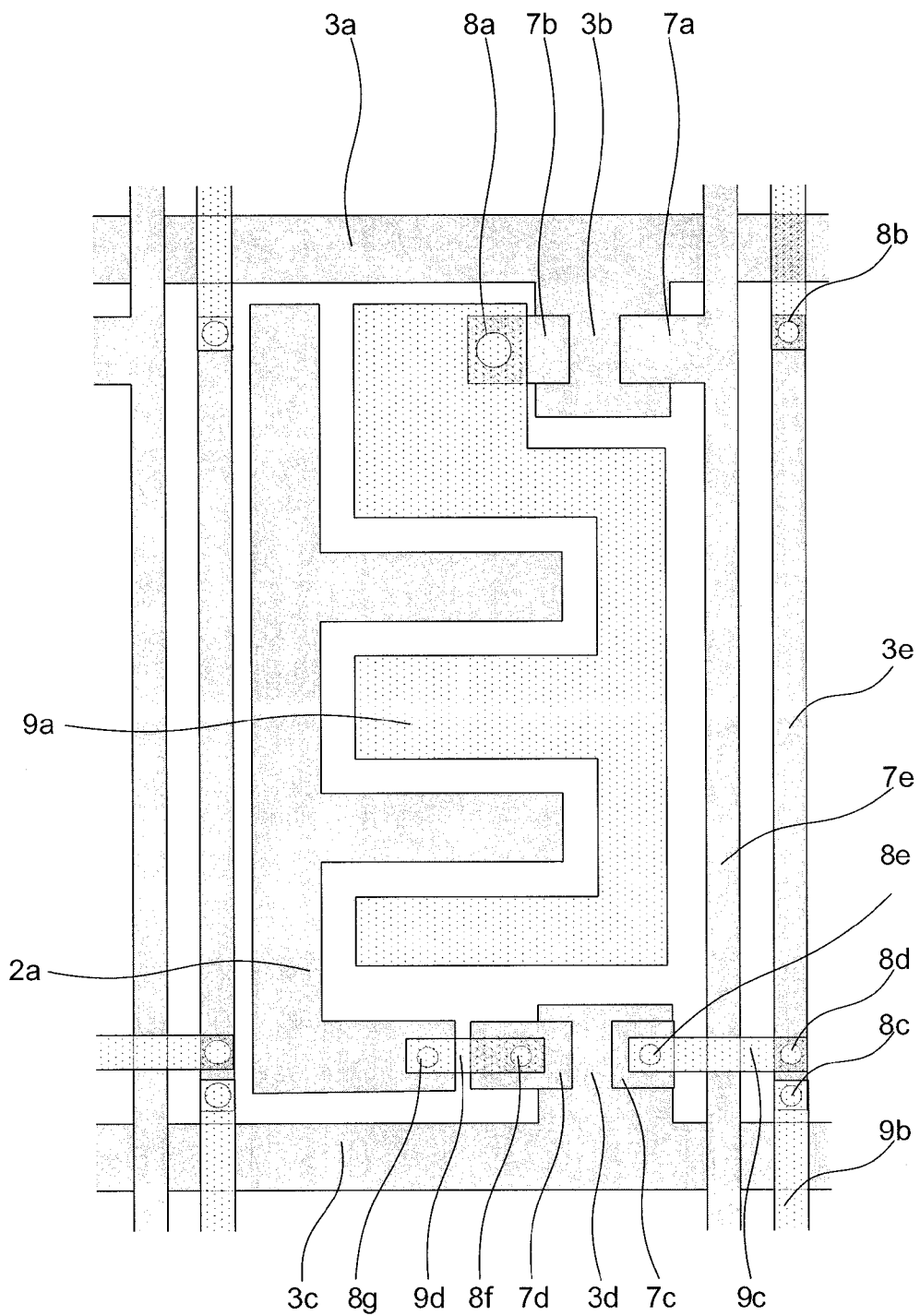
FIG. 12 is a plan view showing a TFT-LCD array substrate according to a fifth embodiment of the invention.
Figure 13:
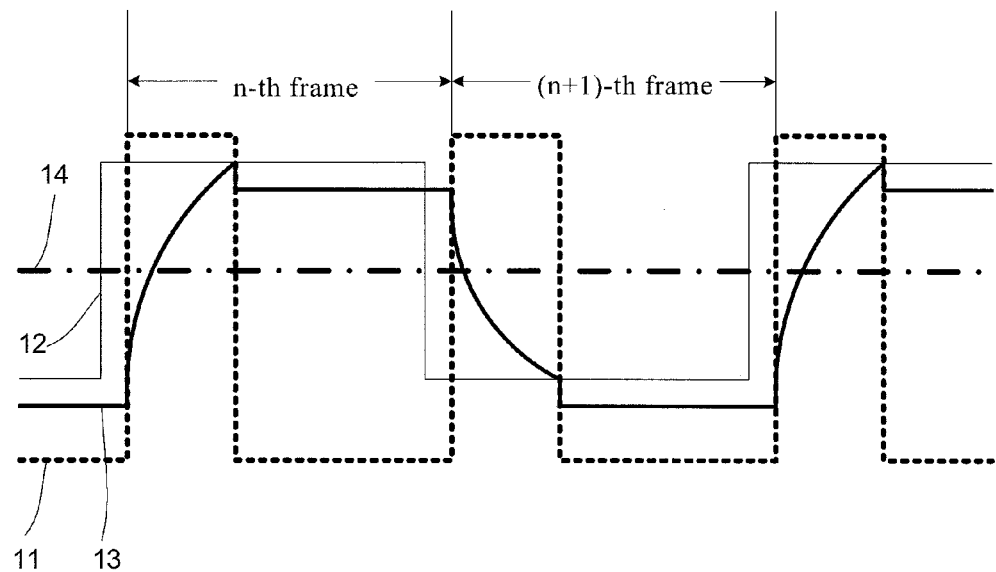
FIG. 13 is a diagram showing the occurrence of the feed through voltage on the pixel electrode of the conventional TFT-LCD array substrate.

FIG. 12 is a plan view showing a TFT-LCD array substrate according to a fifth embodiment of the invention. The array substrate shown in FIG. 12 is different from that in FIG. 11 in that the second pixel electrode 2a is formed by the same material as the first gate line 3a and the second gate line 3c, and the first pixel electrode 9a is formed by transparent conductive film.

In the above-described embodiments, the second pixel electrode is provided on the array substrate. A liquid crystal display panel is provided in another embodiment of the invention in which the second pixel electrode is provided on the color filter substrate. The liquid crystal display panel comprises the array substrate, the color filter substrate and a liquid crystal layer sandwiching between the substrates. In this embodiment, the first pixel electrode and the first TFT are formed on the array substrate, and the first TFT is connected with the first pixel electrode; the second TFT and the second pixel electrode are formed on the color filter substrate, and the second TFT is connected with the second pixel electrode; the first TFT and the second TFT are turned on or off simultaneously. Even though the second TFT and the second pixel electrode are provided on the color filter substrate in this embodiment, the discontinuity of the voltage difference applied on both sides of the liquid crystal molecules resulting from existence of the feed through can be prevented between two adjacent frames.

A first embodiment of the method of manufacturing a TFT-LCD array substrate in the invention comprises the following steps.

Step 11. Forming a second pixel electrode, a second gate line, a second gate electrode, a first gate line, a first gate electrode and a second data line segment in each pixel region on a substrate by patterning process, wherein the first gate electrode is connected with the first gate line, and the second gate electrode is connected with the second gate line.

Step 12. Depositing a gate insulating film, a semiconductor layer, a doped semiconductor layer and a source/drain metal film on the substrate after the Step 11, and forming a first source electrode, a first drain electrode, a second source electrode, a second drain electrode and a first data line by a pattering process using a half-tone mask or a gray-tone mask, wherein one end of the first source electrode is positioned above the first gate electrode and the other end thereof is connected with the first data line, the first drain electrode is positioned above and partially overlaps with the first gate electrode and is provided opposite to the first source electrode, the second source electrode is positioned above the second gate electrode, the second source electrode and the second data line segment are respectively provided on both sides of the first data line, the second drain electrode is positioned above and partially overlaps with the second gate electrode and is provided opposite to the second source electrode.

Step 13. Deposing a passivation layer on the substrate after the Step 12 and forming via holes in the passivation layer by patterning process, wherein the via holes comprise a first via hole, a second via hole, a third via hole, a fourth via hole, a fifth via hole, a sixth via hole and a seventh via hole, wherein the first via hole is positioned on the first drain electrode, the second via hole and the third via hole are respectively provided on the upper end portion and the lower end portion of the second data line segment, the fourth via hole is provided at the position on the lower end portion of the second data line segment opposite to the second source electrode, the fifth via hole is positioned on the second source electrode, the sixth via hole is positioned on the second drain electrode, and the seventh via hole is provided at the position on the second pixel electrode opposite to the sixth via hole.

Step 14. Depositing a transparent conductive film on the substrate after the Step 13 and forming a first pixel electrode, a first connection bar, a second connection bar and a third connection bar by a patterning process, wherein the first pixel electrode is connected with the first drain electrode through the first via hole, the first connection bar is used to connect the second via hole of the second data line segment in one pixel region and the third via hole of the second data line segment in another adjacent pixel region so that the second data line segments in the adjacent pixel regions within a same column are connected together to form one second data line, the second source electrode is connected with the second data line segment by the second connection bar through the fifth via hole and the fourth via hole, the second drain electrode is connected with the second pixel electrode by the third connection bar through the sixth via hole and the seventh via hole.

In the Step 11, the second pixel electrode, the second gate line, the second gate electrode, the first gate line, the first gate electrode and the second data line segment may be formed by two patterning processes which comprise the following steps.

Step 111. Depositing a transparent conductive film on the substrate, and forming the second pixel electrode by a first patterning process;

Step 112. Depositing a gate metal film on the substrate after the Step 111, and forming the second gate line, the second gate electrode, the first gate line, the first gate electrode and the second data line segment by a second patterning process.

In addition, the Step 11 in the first embodiment of the method of manufacturing the TFT-LCD array substrate may be performed as follows: the second pixel electrode, the second gate electrode, the first gate line, the first gate electrode and the second data line segment are formed in each pixel region on the substrate by a patterning process, and both of the first gate electrode and the second gate electrode are connected with the first gate line.

The steps in the first embodiment of the method of manufacturing the TFT-LCD array substrate have been described with reference to FIG. 1a-5c, and the detail description thereof is omitted here.

Similar to the first embodiment of the method, a second embodiment of the method of manufacturing the TFT-LCD array substrate in the invention comprises the following steps.

Step 1. Forming a first gate line, a second pixel electrode, a first gate electrode, a second data line segment, and a second gate electrode in each pixel region on the substrate by a patterning process, wherein both of the first gate electrode and the second gate electrode are connected with the first gate line.

Step 2. Forming a first data line, a first source electrode, a first drain electrode, a second data line, a second source electrode, a second drain electrode, a first TFT channel and a second TFT channel on the substrate after the Step 1.

Step 3. Depositing a passivation layer on the substrate after the Step 2 and forming via holes in the passivation layer.

Step 4. Depositing a transparent conductive film on the substrate after the Step 3 and forming a first pixel electrode, wherein a second TFT is connected with a second pixel electrode through one via hole in the passivation layer, and the first TFT is connected with the first pixel electrode through another via hole in the passivation layer.

A third embodiment of the method of manufacturing the TFT-LCD array substrate in the invention comprises the following steps.

Step 21. Forming a second pixel electrode, a second gate line, a second gate electrode, a first gate line, and a first gate electrode in each pixel region on the substrate by a patterning process, wherein the first gate electrode is connected with the first gate line, and the second gate electrode is connected with the second gate line.

Step 22. Depositing a gate insulating film, a semiconductor layer, a doped semiconductor layer and a source/drain metal film on the substrate after the Step 21, and forming a first source electrode, a first drain electrode, a second source electrode, a second drain electrode, a first data line and a second data line by a pattering process using a half-tone mask or a gray-tone mask, wherein one end of the first source electrode is positioned above the first gate electrode and the other end thereof is connected with the first data line, the first drain electrode is positioned above and partially overlaps with the first gate electrode and is provided opposite to the first source electrode, the second source electrode is positioned above the second gate electrode, the second source electrode and the second data line are respectively provided on both sides of the first data line, and the second drain electrode is positioned above and partially overlaps with the second gate electrode and is provided opposite to the second source electrode.

Step 23. Deposing a passivation layer on the substrate after the Step 22 and forming via holes in the passivation layer by a patterning process, wherein the via holes comprise a first via hole, a fourth via hole, a fifth via hole, a sixth via hole and a seventh via hole, the first via hole is positioned on the first drain electrode, the fourth via hole is provided at the position on the lower end portion of the second data line opposite to the second source electrode, the fifth via hole is positioned on the second source electrode, the sixth via hole is positioned on the second drain electrode, and the seventh via hole is provided at the position on the second pixel electrode opposite to the sixth via hole.

Step 24. Depositing the transparent conductive film on the substrate after the Step 23 and forming a first pixel electrode, a second connection bar and a third connection bar by a patterning process, wherein the first pixel electrode is connected with the first drain electrode through the first via hole, the second source electrode is connected with the second data line by the second connection bar through the fifth via hole and the fourth via hole, and the second drain electrode is connected with the second pixel electrode by the third connection bar through the sixth via hole and the seventh via hole.

In the Step 21, the second pixel electrode, the second gate line, the second gate electrode, the first gate line and the first gate electrode can be formed by two patterning processes which comprise the following steps.

Step 211. Depositing the transparent conductive film on the substrate, and forming the second pixel electrode by a first patterning process.

Step 212. Depositing the gate metal film on the substrate after the Step 211, and forming the second gate line, the second gate electrode, the first gate line and the first gate electrode by a second patterning process.

In addition, the Step 21 in the third embodiment of the method of manufacturing the TFT-LCD array substrate may be carried out as follows: the second pixel electrode, the second gate electrode, the first gate line, the first gate electrode are formed on the substrate by a patterning process, and both of the first gate electrode and the second gate electrode are connected with the first gate line.

The steps in the third embodiment of the method of manufacturing the TFT-LCD array substrate have been described with reference to FIG. 7a-10b, and the detail description thereof is omitted here.

According to the method of manufacturing the TFT-LCD array substrate in the invention, the second pixel electrode acting as a common electrode is individually provided in each of the pixel regions without forming an integral common electrode on the entire substrate. In addition, each second pixel electrode is controlled by one second TFT, the same gate driving signal is input to the first gate line and the second gate line so that the first TFT and the second TFT are simultaneously turned on or off, the first data line supplies the data signal to the first pixel electrode and the second data line supplies the common voltage of common electrode to the second pixel electrode. Because of the existence of the feed through voltage, both of the voltage applied on the first pixel electrode and the voltage applied on the second pixel electrode decrease. Since the gate voltages of the first TFT and the second TFT are equal to each other and the parameters such as Cgd, Cst and Clc for calculating the feed through voltage are all equal for the first pixel electrode and the second pixel electrode, the first pixel electrode and the second pixel electrode will have the same feed through voltage according to the above-described expression of the feed through voltage, and thus the voltage difference between the first pixel electrode and the second pixel electrode is equal to the desired voltage difference. Therefore, during two adjacent frames, the voltage difference applied on both sides of the liquid crystal molecules is equal to the desired voltage difference. In this way, the discontinuity of the voltage difference applied on both sides of the liquid crystal molecules can be prevented between the two adjacent frames and thus the display quality can be improved.

A method for driving the TFT-LCD array substrate is further provided in an embodiment of the invention. As for the array substrates shown in FIG. 1a or FIG. 6a, the driving method is carried out as follows: a same gate driving signal is input to the first gate line and the second gate line, a data signal is input to the first data line and a common voltage of common electrode is input to the second data line. By the driving method, the first TFT and the second TFT are simultaneously turned on or off, the first pixel electrode and the second pixel electrode have the same feed through voltage, and thus the discontinuity of the voltage difference applied on both sides of the liquid crystal molecules can be prevented between two adjacent frames and display quality can be improved.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A thin film transistor liquid crystal display (TFT-LCD) array substrate, comprising:
  a plurality of first gate lines, a plurality of second gate lines, and a plurality of first data lines, and a plurality of pixel regions defined by intersecting of the first gate lines and the first data lines with each other, the first and second gate lines extending parallel to each other, each of the pixel regions comprising:
  a first pixel electrode and a first thin film transistor (TFT), wherein the first gate line is connected with a first gate electrode of the first TFT, the first TFT is connected with the first pixel electrode to control a display voltage applied on the first pixel electrode,
  a second TFT and a second pixel electrode, wherein the second gate line is connected with a second gate electrode of the second TFT, the second TFT is connected with the second pixel electrode to control a common voltage applied on the second pixel electrode,
  a second data line for supplying the common voltage, wherein the second data line is connected with a second source electrode of the second TFT, and the second pixel electrode is connected with a second drain electrode of the second TFT,
  wherein the first pixel electrode and the second pixel electrode form the voltage difference to drive liquid crystal molecules, and the first TFT and the second TFT are turned on or off simultaneously; and,
  wherein each pixel region further comprises a second data line segment and a first connection bar, wherein the second data line segments in adjacent pixel regions within a same column are connected by the first connection bar to form the second data line.

2. The TFT-LCD array substrate according to claim 1, wherein a first via hole and a second via hole are provided on the second data line segment, and the second data line segments in adjacent pixel regions within a same column are connected by the first connection bar through the first via hole and the second via hole.

3. The TFT-LCD array substrate according to claim 1, wherein the second source electrode is connected with the second data line by a connection bar, the connection bar is respectively connected with a fourth via hole provided on the second source electrode and a third via hole provided on the second data line, the second drain electrode is connected with the second pixel electrode by a another connection bar, and the another connection bar is respectively connected with a fifth via hole provided on the second drain electrode and a sixth via hole provided on the second pixel electrode.

4. The TFT-LCD array substrate according to claim 3, wherein the first gate line, the first gate electrode of the first TFT and a second gate electrode of the second TFT are formed in a same patterning process.

5. The TFT-LCD array substrate according to claim 4, wherein a first source electrode of the first TFT, a first drain electrode of the first TFT, the second source electrode of the second TFT, the second drain electrode of the second TFT, the first data line, the second date line, a first TFT channel and a second TFT channel are formed in a same patterning process.

\* \* \* \* \*